United States Patent
Lee et al.

(10) Patent No.: US 7,618,832 B2
(45) Date of Patent: Nov. 17, 2009

(54) SEMICONDUCTOR SUBSTRATE HAVING REFERENCE SEMICONDUCTOR CHIP AND METHOD OF ASSEMBLING SEMICONDUCTOR CHIP USING THE SAME

(75) Inventors: Sang-moon Lee, Yongin-si (KR); Young-bu Kim, Seongnam-si (KR); Jung-hye Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 418 days.

(21) Appl. No.: 11/336,687

(22) Filed: Jan. 20, 2006

(65) Prior Publication Data

US 2006/0166383 A1 Jul. 27, 2006

(30) Foreign Application Priority Data

Jan. 22, 2005 (KR) .................. 10-2005-0006102

(51) Int. Cl.
*H01L 21/02* (2006.01)
*H01L 21/66* (2006.01)
*H01L 23/544* (2006.01)

(52) U.S. Cl. .................. 438/17; 438/975; 209/573; 700/121; 702/81; 257/797; 257/E23.179; 257/E21.524; 257/E21.525

(58) Field of Classification Search .......... 438/3, 438/17, 4, 975; 209/573; 700/121; 702/81; 257/797, E23.179, E21.521, E21.524, E21.525
See application file for complete search history.

(56) References Cited

U.S. PATENT DOCUMENTS

| 4,510,673 | A | * | 4/1985 | Shils et al. ............. 438/15 |
|---|---|---|---|---|
| 5,043,657 | A | * | 8/1991 | Amazeen et al. ......... 438/18 |
| 5,726,920 | A | * | 3/1998 | Chen et al. |
| 5,796,264 | A | * | 8/1998 | Farnworth et al. ........ 324/758 |
| 5,838,361 | A | * | 11/1998 | Corbett |
| 5,952,241 | A | * | 9/1999 | Baker et al. |
| 6,051,845 | A | * | 4/2000 | Uritsky |
| 6,154,043 | A | * | 11/2000 | Conboy et al. |
| 6,262,388 | B1 | * | 7/2001 | Canella et al. ........ 219/121.68 |
| 6,303,899 | B1 | * | 10/2001 | Johnson et al. |
| 6,324,298 | B1 | * | 11/2001 | O'Dell et al. |
| 6,417,068 | B1 | * | 7/2002 | Bruce et al. ............. 438/401 |
| 6,417,484 | B1 | * | 7/2002 | Canella et al. ........ 219/121.68 |
| 6,420,792 | B1 | * | 7/2002 | Guldi et al. ............. 257/797 |
| 6,504,948 | B1 | * | 1/2003 | Schemmel et al. |
| 6,528,760 | B1 | * | 3/2003 | Canella et al. ........ 219/121.82 |
| 6,589,801 | B1 | * | 7/2003 | Yoon et al. .............. 438/15 |
| 6,600,329 | B2 | * | 7/2003 | Lee ........................ 324/754 |
| 6,617,870 | B1 | * | 9/2003 | Lee et al. |
| 6,635,968 | B2 | * | 10/2003 | Usami |

(Continued)

FOREIGN PATENT DOCUMENTS

JP 61-170041 7/1986

(Continued)

*Primary Examiner*—M. Wilczewski
(74) *Attorney, Agent, or Firm*—Mills & Onello, LLP

(57) ABSTRACT

A semiconductor substrate having a reference semiconductor chip and a method of assembling semiconductor chips using the same are provided. According to the method, a semiconductor substrate having a plurality of semiconductor chips is provided. An identification mark is made on a reference semiconductor chip among the semiconductor chips. The semiconductor substrate is aligned with reference to the reference semiconductor chip, so that an electrical die sorting test can be performed on the semiconductor chips on the semiconductor substrate.

14 Claims, 5 Drawing Sheets

U.S. PATENT DOCUMENTS

| | | | | |
|---|---|---|---|---|
| 6,673,692 B2 * | 1/2004 | Peterson | .................... | 438/401 |
| 6,756,796 B2 * | 6/2004 | Subramanian | ............... | 324/750 |
| 6,763,578 B2 * | 7/2004 | Farnworth et al. | ............ | 29/833 |
| 6,795,743 B1 * | 9/2004 | Bell et al. | .................... | 700/115 |
| 6,826,422 B1 * | 11/2004 | Modell et al. | ............... | 600/407 |
| 6,861,608 B2 * | 3/2005 | Koduri et al. | ............... | 209/573 |
| 6,977,516 B2 * | 12/2005 | Ferreira et al. | .............. | 324/765 |
| 6,996,484 B2 * | 2/2006 | Raitter | ........................ | 702/81 |
| 7,028,890 B2 * | 4/2006 | Tani | ........................ | 235/380 |
| 7,063,989 B2 * | 6/2006 | Hwang et al. | .................. | 438/5 |
| 7,067,763 B2 * | 6/2006 | Schramm | ............... | 219/121.69 |
| 7,107,117 B2 * | 9/2006 | Beffa | ........................ | 700/121 |
| 7,117,063 B2 * | 10/2006 | Beffa | ........................ | 700/121 |
| 7,119,351 B2 * | 10/2006 | Woelki | .................... | 250/559.4 |
| 7,120,287 B2 * | 10/2006 | Wilson et al. | ............... | 382/145 |
| 7,124,050 B2 * | 10/2006 | Beffa | ........................ | 702/119 |
| 7,189,938 B2 * | 3/2007 | Koduri et al. | ............... | 209/573 |
| 7,276,672 B2 * | 10/2007 | Beffa | ........................ | 209/573 |
| 7,379,581 B2 * | 5/2008 | Peak | ........................ | 382/151 |
| 7,440,860 B2 * | 10/2008 | Raitter | ........................ | 702/81 |
| 7,502,659 B2 * | 3/2009 | Beffa | ........................ | 700/121 |
| 2001/0038153 A1 * | 11/2001 | Sakaguchi | | |
| 2002/0043970 A1 * | 4/2002 | Lee | ........................ | 324/158.1 |
| 2002/0182759 A1 * | 12/2002 | Yamagata et al. | ............. | 438/11 |
| 2003/0033101 A1 * | 2/2003 | Raitter | ........................ | 702/81 |
| 2003/0106209 A1 * | 6/2003 | Farnworth et al. | ............ | 29/833 |
| 2003/0224557 A1 * | 12/2003 | Koduri et al. | ................ | 438/110 |
| 2004/0152233 A1 * | 8/2004 | Nemets et al. | .............. | 438/106 |
| 2004/0171179 A1 * | 9/2004 | Farnworth et al. | ............ | 438/15 |
| 2004/0185581 A1 * | 9/2004 | Hwang et al. | .................. | 438/5 |
| 2005/0283266 A1 * | 12/2005 | Geraci et al. | ................ | 700/115 |
| 2006/0030963 A1 * | 2/2006 | Beffa | ........................ | 700/116 |
| 2006/0108678 A1 * | 5/2006 | Kumar et al. | ............... | 257/690 |
| 2006/0166383 A1 * | 7/2006 | Lee et al. | .................... | 438/15 |
| 2007/0082462 A1 * | 4/2007 | Kim et al. | .................... | 438/458 |
| 2007/0138252 A1 * | 6/2007 | Lee et al. | | |
| 2008/0083996 A1 * | 4/2008 | Kudo | | |
| 2008/0205746 A1 * | 8/2008 | Ko et al. | | |

FOREIGN PATENT DOCUMENTS

| | | | |
|---|---|---|---|
| JP | 06-232221 | | 8/1994 |
| JP | 6-349902 | * | 12/1994 |
| JP | 07-147303 | | 6/1995 |
| JP | 2003-115424 | * | 4/2003 |
| JP | 2004-074210 | | 3/2004 |
| KR | 10-1994-0004251 | | 5/1994 |
| KR | 10-2001-0073299 | | 8/2001 |
| KR | 10-2003-0029483 | | 4/2003 |

* cited by examiner

SEMICONDUCTOR SUBSTRATE HAVING REFERENCE SEMICONDUCTOR CHIP AND METHOD OF ASSEMBLING SEMICONDUCTOR CHIP USING THE SAME

CROSS-REFERENCE TO RELATED PATENT APPLICATION

This application claims the benefit of Korean Patent Application No. 10-2005-0006102, filed on Jan. 22, 2005, in the Korean Intellectual Property Office, the contents of which are incorporated herein in their entirety by reference.

BACKGROUND OF THE INVENTION

1. Field of the Invention

The present invention relates to a semiconductor substrate and a method of assembling semiconductor chips, and more particularly, to a method of assembling semiconductor chips including performing an electrical die sorting test on a semiconductor substrate having a plurality of semiconductor chips and physically separating the semiconductor chips.

2. Description of the Related Art

In general, a plurality of semiconductor chips is simultaneously manufactured in the form of a matrix on a semiconductor substrate, e.g., a silicon substrate. Each semiconductor chip divided by the matrix on a semiconductor substrate is called a die. After the operation to manufacture the semiconductor chips on the semiconductor substrate is completed, an electrical test for the respective semiconductor chips on the semiconductor substrate is performed, whereby defective semiconductor chips are detected.

The electrical test to detect defective dies is called an electrical die sorting (EDS) test. After the EDS test, an operation to assemble the semiconductor chips is performed.

Problems with the conventional EDS test and the assembly operation will be described referring to the accompanying drawings. Referring to FIG. 1, a semiconductor substrate 100 including semiconductor chips 10, 20, and 30 and others arranged in the form of a matrix is illustrated.

Some of the semiconductor chips 10, 20, and 30 formed on the semiconductor substrate 100 are excluded from the EDS test. For example, in FIG. 1, the semiconductor chips 20 and 30 inside an imaginary region 105 on the semiconductor substrate 100 are EDS test targets and the semiconductor chip 10 and other chips outside the imaginary region 105 are not EDS test targets. Since the semiconductor chips on the edge of the semiconductor substrate 100 are not perfectly patterned or correspond to a portion out of a process margin, they are considered to be defective from the beginning. The imaginary region 105 on the semiconductor substrate is not indicated in a real process.

Accordingly, when performing the EDS test or the assembly operation for the semiconductor substrate 100, the first semiconductor chip or die to be processed, for example the chip 20, is difficult to discriminate merely by its appearance. An alignment operation or other operations are performed using the first semiconductor chip or die 20 as a reference when the semiconductor substrate 100 is loaded on the EDS tester or an assembly device.

However, the first semiconductor chip needs an identification mark because there are many other semiconductor chips including the chips 10, 30 proximate to the first semiconductor chip 20. Referring to FIG. 2, a related art method for indicating the first semiconductor chip or die by using ink is illustrated. An ink mark is used mainly for indicating defective semiconductor chips after the EDS test rather than for indicating the first semiconductor chip. An ink mark 70 is positioned on a polyimide layer 60 that covers a passivation layer 55 on a silicon wafer 50. The thickness of the silicon wafer is about 674 μm, the polyimide layer is about 4 μm thick, and the ink is about 25 μm thick. An ink marking error occurs frequently because it is hard to distinguish the first semiconductor chip 20 in FIG. 1 from other semiconductor chips including the chips 10, 30 proximate to the first semiconductor chip 20.

Recently, products performing the assembly operation without the ink mark after the EDS test have been developed. In the case of a semiconductor substrate without an ink mark, the assembly operation is performed using the coordinate data of a semiconductor chip or die. Accordingly, the coordinates of the first semiconductor chip or die are especially important. Most products are processed without the ink mark due to reduction of the thickness of a back-lap and foundry businesses.

The indication of the first semiconductor chip or die on the substrate during the EDS test and the assembly operation becomes a very important issue. However, there have been frequent errors because the first die is not distinguishable from other dies in its appearance. In particular, there have been still frequent errors in pointing out the first die even though a limit sample is prepared and used as a guideline to accurately distinguish the first die.

SUMMARY OF THE INVENTION

The present invention provides a method of assembling semiconductor chips using a reference semiconductor chip.

The present invention also provides a semiconductor substrate with an indication of the reference semiconductor chip.

According to an aspect of the present invention, there is provided a method of assembling semiconductor chips, which includes: providing a semiconductor substrate having a plurality of semiconductor chips; making an identification mark on a reference semiconductor chip among the semiconductor chips; and aligning the semiconductor substrate referring to the reference semiconductor chip and performing an electrical die sorting test for the semiconductor chips on the semiconductor substrate.

The identification mark may be produced by illuminating a laser on the reference semiconductor chip. Moreover, the focus size of the laser may be adjusted according to the size of the reference semiconductor chip. Alternatively, the laser may be applied by changing the surface of the reference semiconductor chip.

Making the identification mark may comprise making a laser mark for identification on the reference semiconductor chip.

Performing the electrical die sorting test can include storing the test results together with coordinates of the semiconductor chips referring to the reference semiconductor chip.

In one embodiment, the method further comprises physically separating the semiconductor chips using the test results after performing the electrical die sorting test. Separating the semiconductor chips can include sorting the semiconductor substrate referring to the reference semiconductor chip. The method of the invention can further include making ink marks on the semiconductor chips using the test results before separating the semiconductor chips. Making the ink mark can be performed using the coordinates stored at the electrical die sorting test.

The reference semiconductor chip may be the first semiconductor chip on the semiconductor substrate for which an EDS test is performed.

According to another aspect of the present invention, there is provided a method of assembling semiconductor chips by sorting and separating a plurality of semiconductor chips on a semiconductor substrate according to the electrical properties of the semiconductor chips. The method includes making an identification mark on a reference semiconductor chip before sorting the semiconductor chips.

In one embodiment, making the identification mark comprises illuminating a laser on the reference semiconductor chip. Illuminating the laser can include adjusting the focus size of the laser according to the area of the reference semiconductor chip. Illuminating the laser can alternatively comprise transforming a surface of the reference semiconductor chip.

In one embodiment, making the identification mark includes making a laser mark for identification on the reference semiconductor chip.

According to a still another aspect of the present invention, there is provided a semiconductor substrate including a plurality of semiconductor chips arranged in the form of a matrix and an identification mark on a reference semiconductor chip.

In one embodiment, the identification mark is a laser mark.

In one embodiment, the identification mark is formed by thermally hardening a surface layer of the reference semiconductor chip.

The semiconductor chip having the identification mark may be the first semiconductor chip to be processed in an assembly operation for the semiconductor chips.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1:
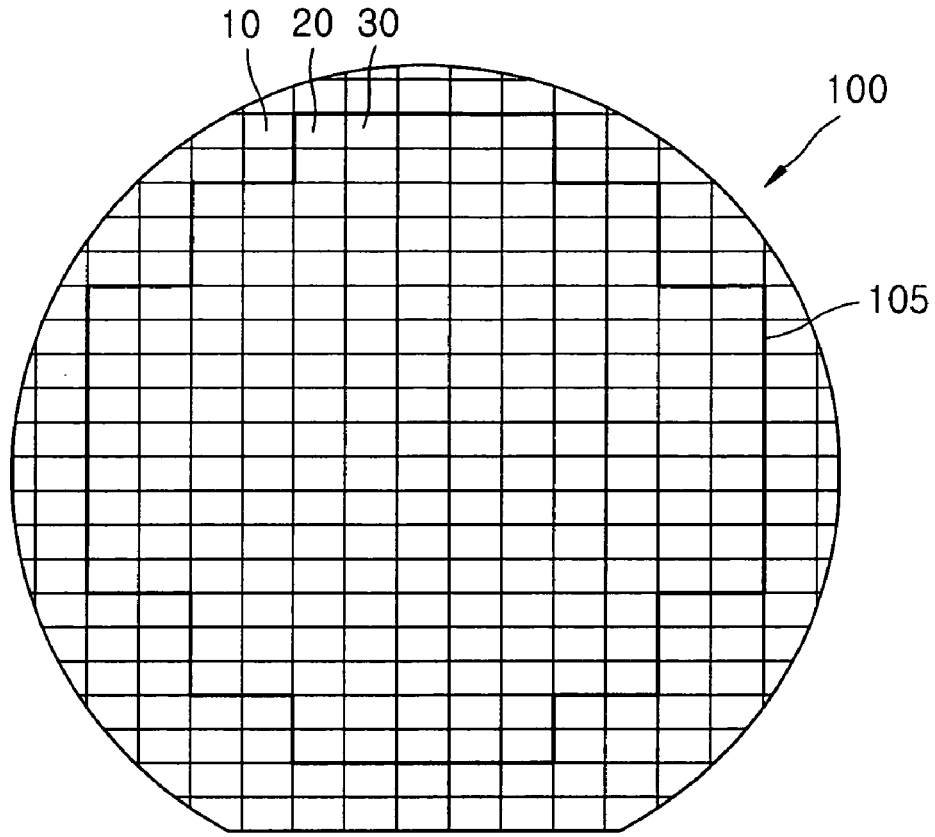
FIG. 1 is a view illustrating a conventional semiconductor substrate including semiconductor chips.
Figure 2:
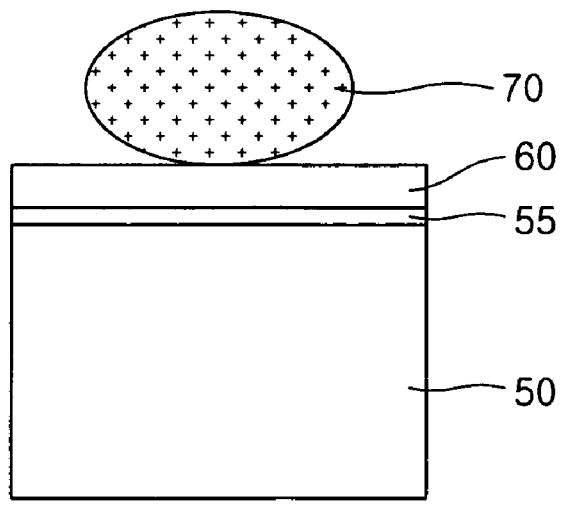
FIG. 2 is a cross-sectional view illustrating a conventional method of making an ink mark for a semiconductor chip.
Figure 3:
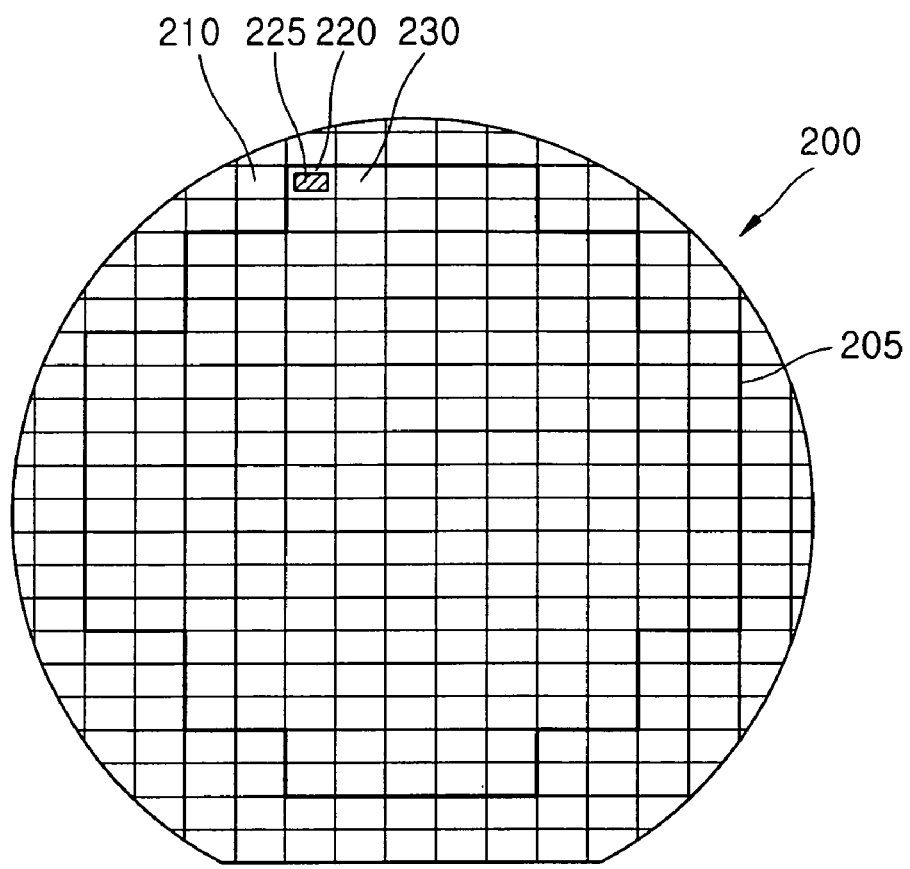
FIG. 3 is a plan view of a semiconductor substrate with a reference semiconductor chip according to an embodiment of the present invention.

FIG. 3 is a plan view of a semiconductor substrate 200 having a reference semiconductor chip 220 according to an embodiment of the present invention. A plurality of semiconductor chips 210, 220, 230, and others on the semiconductor substrate 200 are arranged in the form of a matrix.

The semiconductor chips 210, 220, 230, and others arranged in the form of a matrix can be formed by photolithography and etching during the manufacturing process. The semiconductor chips 210, 220, 230, and others may be called dies.

The number of the semiconductor chips 210, 220, 230, and others can be changed according to the integration degree of the semiconductor substrate 200. FIG. 3 is a plan view exemplarily illustrating the semiconductor chips 210, 220, 230 and others. The semiconductor chips 210, 230 and others, except the reference semiconductor chip 220, are indistinguishable in their appearance as long as they are not specially processed. That is, the reference semiconductor chip 220 is distinguishable from the semiconductor chips 210, 230, and others.

As illustrated in FIG. 3, some of the semiconductor chips 210, 220, 230, etc. on the semiconductor substrate 200 are excluded from an EDS test and an assembly operation. For example, the semiconductor chip 210 and others outside the area 205 are excluded from the EDS test and the assembly operation at the beginning, but the semiconductor chips, 220, 230, and others inside the area 205 are the target of the EDS test and the assembly operation. The area 205 is not explicitly marked on the substrate, as shown in FIG. 3.

Any arbitrary semiconductor chip can be used as the reference semiconductor chip 220. However, it is desirable that the first semiconductor chip for which the EDS test is performed is used as the reference semiconductor chip 220. Accordingly, an EDS test device can align the semiconductor substrate 206 referring to the reference semiconductor chip 220. Furthermore, the EDS test can be performed by receiving coordinates of the target chips for the EDS test using the reference semiconductor chip 220.

That is, the EDS test can be performed using the reference semiconductor chip 220 that is marked. As a result, the EDS test according to the present embodiment reduces the number of errors compared with the conventional method of locating the first semiconductor chip using only coordinates. Moreover, making an ink mark on a semiconductor chip can also be performed using the reference semiconductor chip 220 during the assembly operation.

In the assembly operation without the ink mark, a process can be performed without errors by receiving the EDS test results through the coordinates generated with respect to the reference semiconductor chip 220.

Figure 4:
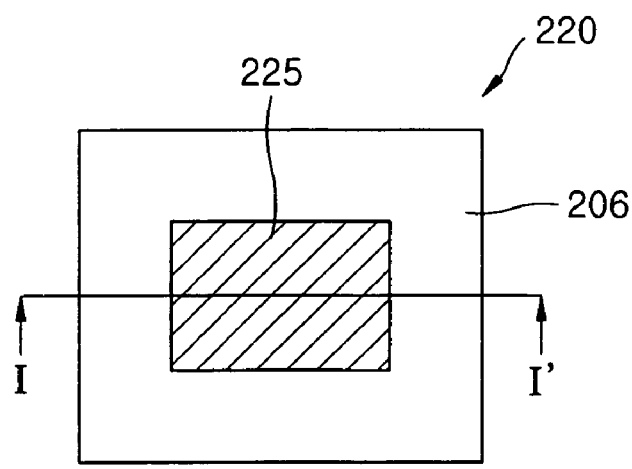
FIG. 4 is a plan view of a reference semiconductor chip according to an embodiment of the present invention.
Figure 5:
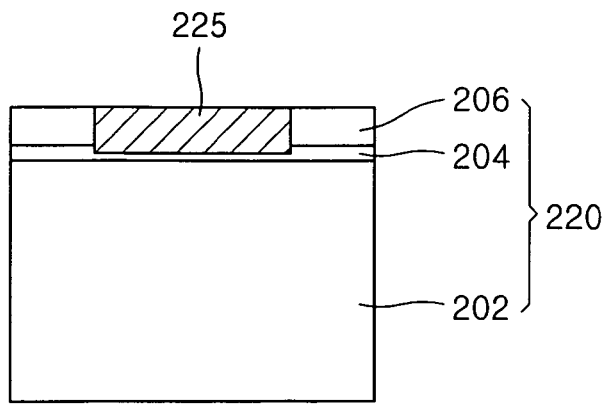
FIG. 5 is a cross-sectional view taken along line I-I' of the reference semiconductor chip in FIG. 4.
Figure 6:
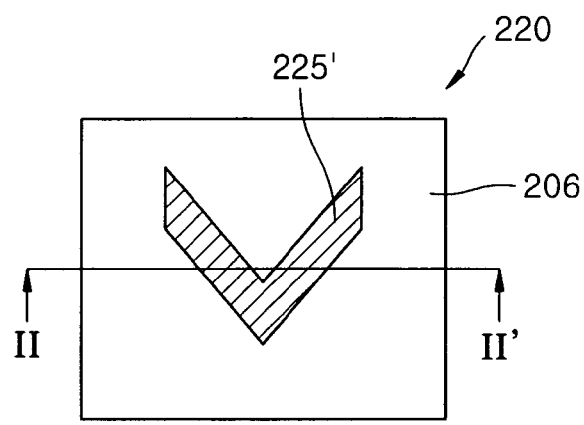
FIG. 6 is a plan view of a reference semiconductor chip according to another embodiment of the invention.

Referring to FIGS. 4 through 6, the reference semiconductor chip 220 in FIG. 3 will be described in more detail.

FIG. 4 is a plan view of the reference semiconductor chip 220 according to an embodiment of the present invention. FIG. 5 is a cross-sectional view taken along line I-I' of the reference semiconductor chip 220 of FIG. 4.

Referring to FIG. 4, an identification mark 225 noticeable in appearance is made on a surface of the reference semiconductor chip 220. Also, the surface of the reference semiconductor chip 220 is made of a polyimide layer 206. In more detail, the identification mark 225 can be a surface layer, i.e., a hardened layer of the polyimide layer 206.

Referring to FIG. 5, the identification mark 225 may include a partially hardened layer of the passivation layer 204 under the polyimide layer 206. Under the passivation layer 204, there is a wafer 202 where a pattern for forming the semiconductor chips is made.

FIG. 6 is a plan view of the reference semiconductor chip 220 according to another embodiment of the present invention.

Figure 7:
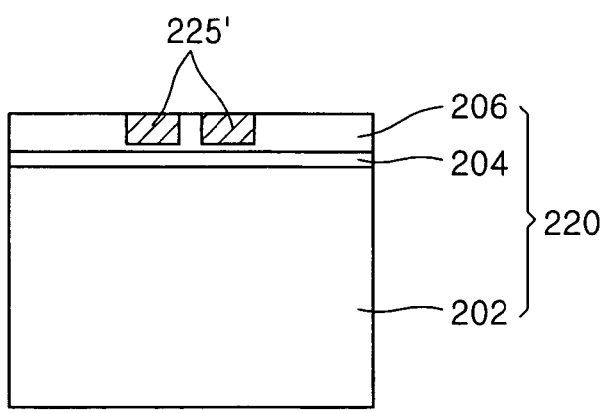
FIG. 7 is a cross-sectional view taken along line II-II' of the reference semiconductor chip in FIG. 6.

FIG. 7 is a sectional view taken along line II-II' of the reference semiconductor chip 220 of FIG. 6.

Referring to FIGS. 6 and 7, a surface of the reference semiconductor chip 220 has an identification mark 225' that is noticeable in appearance. In detail, the identification mark 225' may be a laser mark formed on a surface layer, e.g., the polyimide layer 206. At this point, though the identification mark 225' has been illustrated as being formed within the polyimide layer 206, it can also be formed across the passivation layer 204.

The identification mark 225' is illustrated as a V-shaped laser mark. Any letter or pattern is applicable for the identification mark 225'.

Figure 8:
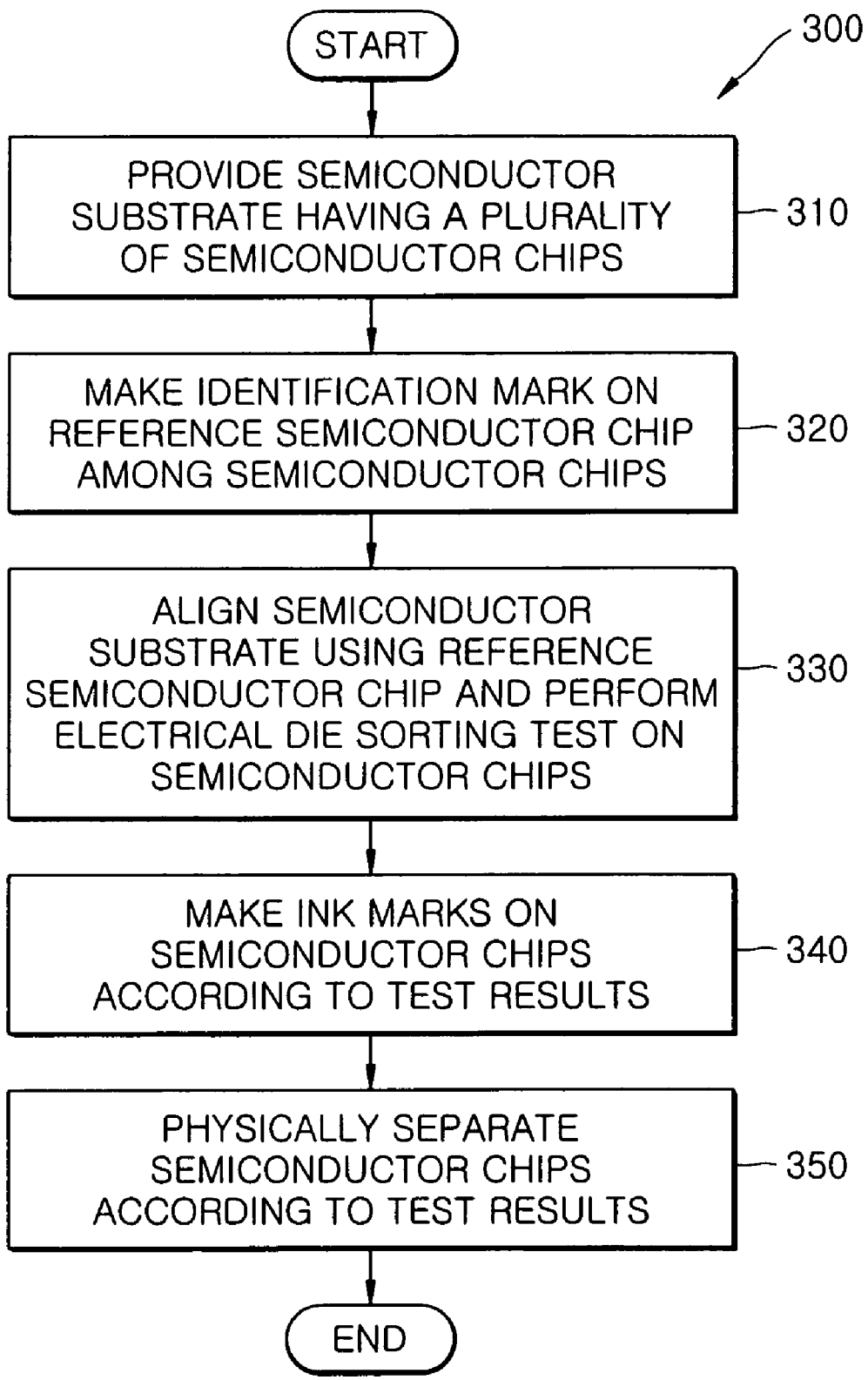
FIG. 8 is a flowchart of a method of assembling semiconductor chips according to an embodiment of the present invention.
Figure 9:
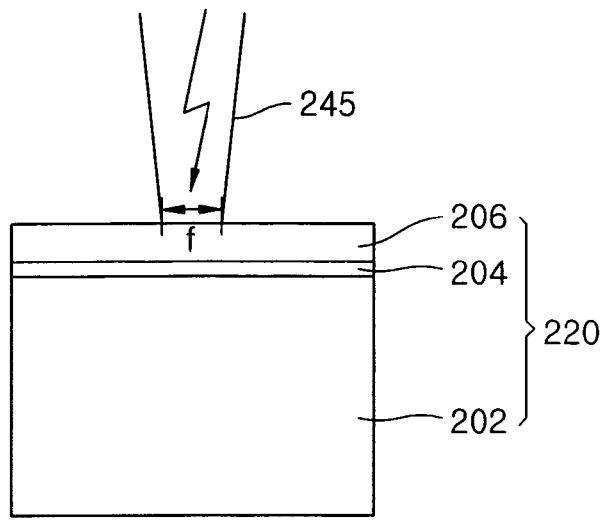
FIG. 9 is a cross-sectional view illustrating a method of making an identification mark for a reference semiconductor chip according to an embodiment of the present invention.
Figure 10:
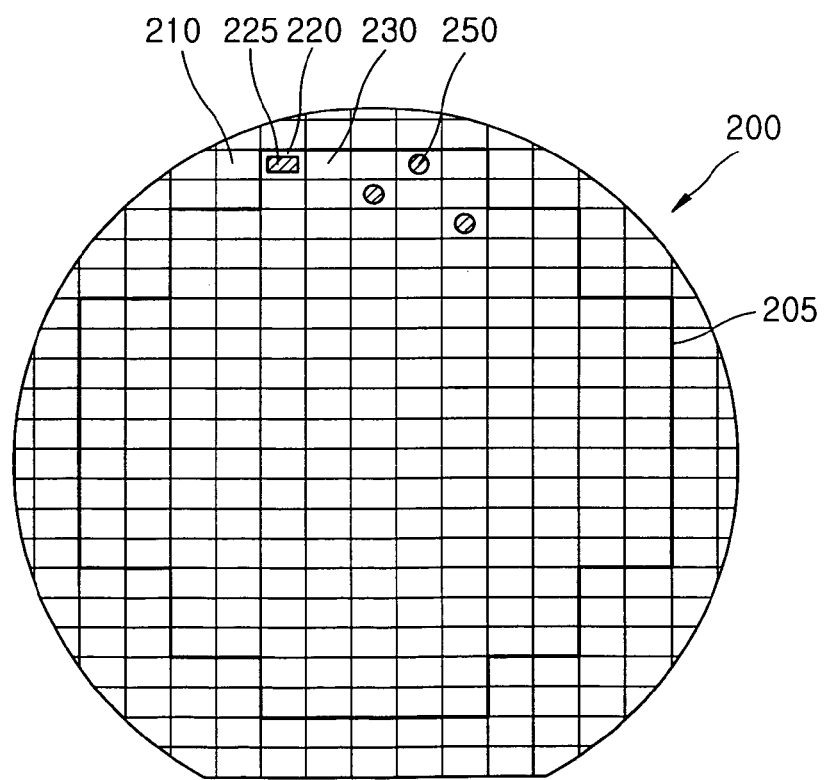
FIG. 10 is a plan view illustrating a method of making an ink mark according to an embodiment of the present invention.

FIG. 8 is a flowchart showing a method 300 for assembling the semiconductor chips according to an embodiment of the present invention. FIG. 9 is a cross-sectional view illustrating a method of making an identification mark on a reference semiconductor chip according to an embodiment of the present invention. FIG. 10 is a plan view illustrating a method of making an ink mark according to an embodiment of the present invention. The method is described in accordance with the flowchart of FIG. 8 with reference to FIGS. 9 and 10, and the assembly process 300 can further refer to FIGS. 3 through 7.

Referring to FIG. 3, there is provided a semiconductor substrate 200 having a plurality of semiconductor chips 210, 220, 230, and others (operation 310 in FIG. 8). The identification mark 225 is made on one reference semiconductor chip 220 among the semiconductor chips 210, 220, 230, and others (operation 320 in FIG. 8). The reference semiconductor chip 220 can be the first chip on which the EDS test is to be performed.

Referring to FIG. 9, the operation 320 may be performed by illuminating the laser 245 on the reference semiconductor chip 220. After illuminating the laser 245, the surface of the reference semiconductor chip 220, for example, the polyimide layer 206 or a combination of the polyimide layer 206 and the passivation layer 204 is transformed and hardened. Accordingly, the reference semiconductor chip 220 is noticeable in appearance compared with other semiconductor chips as shown in FIGS. 4 and 5.

Referring again to FIG. 9, the focus size f of the laser 245 is adjustable according to the surface area of the reference semiconductor chip 220. That is, the size of the laser mark can be adjusted so as to be limited inside the reference semiconductor chip 220 when illuminating the laser 245.

The making of the identification mark (operation 320 in FIG. 8) can also be performed by a process of making the laser mark on the reference semiconductor chip 220 using illumination of the laser 245. According to the process, the laser mark as illustrated in FIGS. 6 and 7 can be made. Accordingly, the reference semiconductor chip 220 becomes noticeable in appearance compared with other semiconductor chips.

Referring to FIG. 10, the semiconductor substrate 200 is aligned using the reference semiconductor chip 220. After the alignment, the EDS test for the semiconductor chips 210, 220, 230, and others is performed (operation 330 in FIG. 8).

In detail, an operator can align the semiconductor substrate 200 by identifying the reference semiconductor chip 220 using the laser mark. If the reference semiconductor chip 220 is aligned, it is possible to set the reference semiconductor chip 220 as the first die to be processed and then designate the coordinates of other semiconductor chips on which the EDS test is to be performed. Accordingly, the problems with the EDS test and the assembly operation due to the conventional error in designating the first semiconductor chip are resolved.

Subsequently, the ink mark 250 is made on the semiconductor chip according to the test results (operation 340 in FIG. 8). The ink mark 250 is an indication of whether the die is defective or not according to the test result. Conversely, it is also possible to make the ink mark 250 on normal dies.

Therefore, the operator can visually distinguish normal dies from defective ones. The process of making the indication mark (operation 340 in FIG. 8) can also be performed by aligning the semiconductor substrate 200 using the reference semiconductor chip 220. The process of making of the indication mark (operation 340) can also be performed using the coordinates stored during the EDS test. The operation 340 can be omitted depending on the products.

Next, the semiconductor chips are separated physically (operation 350 in FIG. 8). An operation of assembling the semiconductor chips including the operation of separating the semiconductor chips can be performed using the reference semiconductor chip 220. In the case of a product without the ink mark 250, the process of assembly can be performed by obtaining the coordinates of the respective semiconductor chips generated with respect to the reference semiconductor chip 220 and the EDS test results. Thus, the normal chips can be distinguished from the defective ones.

Subsequently, the assembly operation can be performed in accordance with a method known to those of ordinary skill in the art.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of assembling semiconductor chips, comprising:
   providing a semiconductor substrate having a plurality of semiconductor chips;
   making an identification mark on a reference semiconductor chip among the semiconductor chips; and
   aligning the semiconductor substrate referring to the reference semiconductor chip and performing an electrical die sorting test on the semiconductor chips after making the identification mark on the reference semiconductor chip.

2. The method of claim 1, wherein the making of the identification mark comprises illuminating a laser on the reference semiconductor chip.

3. The method of claim 2, wherein the illuminating of the laser comprises adjusting the focus size of the laser according to the area of the reference semiconductor chip.

4. The method of claim 2, wherein the illuminating of the laser comprises transforming a surface of the reference semiconductor chip.

5. The method of claim 1, wherein the making of the identification mark comprises making a laser mark for identification on the reference semiconductor chip.

6. The method of claim 1, wherein the performing of the electrical die sorting test comprises storing the test results together with coordinates of the semiconductor chips referring to the reference semiconductor chip.

7. The method of claim 1, further comprising physically separating the semiconductor chips using the test results after the performing of the electrical die sorting test.

8. The method of claim 7, wherein the separating of the semiconductor chips comprises sorting the semiconductor substrate referring to the reference semiconductor chip.

9. The method of claim 7, further comprising making ink marks on the semiconductor chips using the test results before the separating of the semiconductor chips.

10. The method of claim 9, wherein the making of the ink mark is performed using the coordinates stored at the electrical die sorting test.

11. The method of claim 1, wherein the reference semiconductor chip on the semiconductor substrate is a first semiconductor chip on which the electric die sorting test is performed.

12. A method of assembling semiconductor chips, comprising:
 providing a semiconductor substrate having a plurality of semiconductor chips;
 making an identification mark on a reference semiconductor chip among the semiconductor chips;
 aligning the semiconductor substrate referring to the reference semiconductor chip and performing an electrical die sorting test on the semiconductor chips; and
 physically separating the semiconductor chips using the test results after the performing of the electrical die sorting test,
 wherein the separating of the semiconductor chips comprises sorting the semiconductor substrate referring to the reference semiconductor chip.

13. A method of assembling semiconductor chips, comprising:
 providing a semiconductor substrate having a plurality of semiconductor chips;
 making an identification mark on a reference semiconductor chip among the semiconductor chips;
 aligning the semiconductor substrate referring to the reference semiconductor chip and performing an electrical die sorting test on the semiconductor chips;
 physically separating the semiconductor chips using the test results after the performing of the electrical die sorting test; and
 making ink marks on the semiconductor chips using the test results before the separating of the semiconductor chips.

14. The method of claim 13, wherein the making of the ink mark is performed using the coordinates stored at the electrical die sorting test.

* * * * *

UNITED STATES PATENT AND TRADEMARK OFFICE
CERTIFICATE OF CORRECTION

PATENT NO. : 7,618,832 B2  Page 1 of 1
APPLICATION NO. : 11/336687
DATED : November 17, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 719 days.

Signed and Sealed this

Twenty-sixth Day of October, 2010

David J. Kappos
*Director of the United States Patent and Trademark Office*